(12) United States Patent
Harada et al.

(10) Patent No.: US 8,283,766 B2
(45) Date of Patent: Oct. 9, 2012

(54) RAMP-STACK CHIP PACKAGE WITH STATIC BENDS

(75) Inventors: John A. Harada, Mountain View, CA (US); David C. Douglas, Palo Alto, CA (US); Robert J. Drost, Los Altos, CA (US)

(73) Assignee: Oracle America, Inc, Redwood Shores, CA (US)

( * ) Notice: Subject to any disclaimer, the term of this patent is extended or adjusted under 35 U.S.C. 154(b) by 233 days.

(21) Appl. No.: 12/874,446

(22) Filed: Sep. 2, 2010

(65) Prior Publication Data

US 2012/0056327 A1 Mar. 8, 2012

(51) Int. Cl.
*H01L 23/52* (2006.01)
*H01L 23/48* (2006.01)
*H01L 23/495* (2006.01)
*H01L 23/02* (2006.01)

(52) U.S. Cl. .......... 257/686; 257/E23.141; 257/723; 257/777; 257/685; 257/728; 257/737; 257/738; 257/778; 257/773; 257/774; 257/691; 257/E23.169; 257/692; 257/784; 257/786

(58) Field of Classification Search .......... 257/773, 257/E23.141, 777, 686, 685, 723, 724, 728, 257/734, 737, 738, 778, 774, 692, 664, 665, 257/786, 784; 174/52.2, 52.3, 52.4; 361/790, 361/761; 385/39

See application file for complete search history.

(56) References Cited

U.S. PATENT DOCUMENTS

| | | | |
|---|---|---|---|
| 6,376,904 B1 | 4/2002 | Haba et al. | |
| 6,812,569 B2 * | 11/2004 | Iwatsu et al. | 257/737 |
| 6,905,911 B2 * | 6/2005 | Hamaguchi et al. | 438/107 |
| 6,921,867 B2 * | 7/2005 | Christensen | 174/254 |
| 7,566,585 B2 * | 7/2009 | Theuss | 438/106 |
| 7,663,246 B2 * | 2/2010 | Chen et al. | 257/777 |
| 2004/0164392 A1 * | 8/2004 | Lee | 257/686 |

(Continued)

FOREIGN PATENT DOCUMENTS

EP 1028463 A1 8/2000

(Continued)

OTHER PUBLICATIONS

O'Reilly, Mike et al., "Jetting Your Way to Fine-pitch 3D Interconnects", Chip Scale Review, Sep./Oct. 2010, pp. 18-21, chipscalereview.com.

(Continued)

*Primary Examiner* — A O Williams
(74) *Attorney, Agent, or Firm* — Park, Vaughan, Fleming & Dowler LLP; Steven E. Stupp

(57) ABSTRACT

A ramp-stack chip package is described. This chip package includes a vertical stack of semiconductor dies or chips that are offset from each other in a horizontal direction, thereby defining a terrace with exposed pads. A high-bandwidth ramp component, which is positioned approximately parallel to the terrace, is electrically and mechanically coupled to the exposed pads. For example, the ramp component may be coupled to the semiconductor dies using: solder, microsprings and/or an anisotropic conducting film. Furthermore, each of the semiconductor dies includes a static bend so that an end segment of each of the semiconductor dies is parallel to the direction and is mechanically coupled to the ramp component. These end segments may facilitate high-bandwidth communication of signals between the chips and the ramp component, for example, via proximity communication.

20 Claims, 6 Drawing Sheets

U.S. PATENT DOCUMENTS

| | | | |
|---|---|---|---|
| 2007/0262437 A1* | 11/2007 | Hosokawa et al. | 257/686 |
| 2008/0083977 A1* | 4/2008 | Haba et al. | 257/686 |
| 2008/0136005 A1* | 6/2008 | Lee et al. | 257/686 |
| 2008/0303131 A1* | 12/2008 | McElrea et al. | 257/686 |
| 2009/0134528 A1* | 5/2009 | Lee et al. | 257/777 |
| 2009/0166839 A1* | 7/2009 | Suzuki et al. | 257/686 |
| 2009/0230528 A1* | 9/2009 | McElrea et al. | 257/676 |
| 2009/0321954 A1 | 12/2009 | Oh | |
| 2011/0018120 A1* | 1/2011 | Drost et al. | 257/692 |
| 2012/0043671 A1* | 2/2012 | Nishiyama et al. | 257/777 |
| 2012/0051695 A1* | 3/2012 | Harada et al. | 385/39 |

FOREIGN PATENT DOCUMENTS

| | | |
|---|---|---|
| EP | 2001036309 | 9/2001 |
| JP | 200136309 A | 9/2001 |
| WO | 9940627 A1 | 8/1999 |

OTHER PUBLICATIONS

Smith, Donald L. et al., "Flip-Chip Bonding on 6-um Pitch using Thin-Film Microspring Technology", Published in Proc. 48th Electronic Components and Technology Conf: Seattle, Washington, May 1998.

Saito, Mitsuko et al., "A 2Gb/s 1.8pJ/b/chip Inductive-Coupling Through-Chip Bus for 128-Die NAND-Flash Memory Stacking", ISSCC 2010 / Session 24/ Dram & Flash Memories / 24.5, 2010, pp. 440-442.

Kang, Uksong et al., "8 Gb 3-D DDR3 DRAM Using Through-Silicon-Via Technology", IEEE Journal of Solid-State Circuits, vol. 45, No. 1, Jan. 2010, pp. 111-119.

Schuylenbergh, Koenraad Van et al., "On-Chip Out-of-Plane High-Q Inductors", IEEE 2002, pp. 364-373.

* cited by examiner

─ 500

```
CONVEY A SIGNAL IN A RAMP COMPONENT WHICH IS ELECTRICALLY AND
RIGIDLY MECHANICALLY COUPLED TO A SET OF SEMICONDUCTOR DIES
THAT ARE ARRANGED IN A VERTICAL STACK
510
```

```
COUPLE THE SIGNAL TO A GIVEN SEMICONDUCTOR DIE AT AN END
SEGMENT OF THE GIVEN SEMICONDUCTOR DIE THAT INCLUDES A STATIC
BEND SO THAT THE END SEGMENT IS PARALLEL TO THE RAMP COMPONENT
512
```

RAMP-STACK CHIP PACKAGE WITH STATIC BENDS

BACKGROUND

1. Field

The present disclosure generally relates to the design of a semiconductor chip package. More specifically, the present disclosure relates to a chip package which includes a group of chips arranged in a stack and a ramp component which is at an angle relative to the stack, and which communicates with the chips at end segments of the semiconductor dies that include static bends.

2. Related Art

Chip packages that include stacked semiconductor chips can provide significantly higher performance in comparison to conventional individually packaged chips that are connected to a printed circuit board. These chip packages also provide certain advantages, such as the ability: to use different processes on different chips in the stack, to combine higher density logic and memory, and to transfer data using less power. For example, a stack of chips that implements a dynamic random access memory (DRAM) can use a high-metal-layer-count, high-performance logic process in a base chip to implement input/output (I/O) and controller functions, and a set of lower metal-layer-count, DRAM-specialized processed chips can be used for the rest of the stack. In this way the combined set of chips may have better performance and lower cost than: a single chip that includes I/O and controller functions manufactured using the DRAM process; a single chip that includes memory circuits manufactured using a logic process; or a system constructed by attempting to use a single process to make both logic and memory physical structures.

It can, however, be difficult to obtain low-cost, high-performance (e.g., high-bandwidth) interconnections between the stacked semiconductor chips. For example, the semiconductor chips can be electrically coupled using wire bonds between exposed bond pads on surfaces in a stack of chips in which the chips are offset from one another to define a staircase of chip edges. But while these wire bonds can be implemented using low-cost assembly techniques, the resulting wire bonds typically have a low bandwidth.

In contrast, through-silicon vias (TSVs) typically have a higher bandwidth than wire bonds. In a TSV fabrication technique, chips are processed so that one or more of the metal layers on their active face are conductively connected to new pads on their back face. Then, chips are adhesively connected in a stack, so that the new pads on the back face of one chip make conductive contact with corresponding pads on the active face of an adjacent chip.

However, TSVs typically have a higher cost than wire bonds. This is because TSVs pass through the active silicon layer of a chip. As a consequence, a TSV occupies area that could have been used for transistors or wiring. This opportunity cost can be large. For example, if the TSV exclusion or keep-out diameter is 20 µm, and TSVs are placed on a 30-µm pitch, then approximately 45% of the silicon area is consumed by the TSVs. This roughly doubles the cost per area for any circuits in the chips in the stack. (In fact, the overhead is likely to be even larger because circuits are typically spread out to accommodate TSVs, which wastes more area.) In addition, fabricating TSVs usually entails additional processing operations, which also increases cost.

Hence, what is needed is a chip package that offers the advantages of stacked chips without the problems described above.

SUMMARY

One embodiment of the present disclosure provides a chip package. This chip package includes a set of semiconductor dies arranged in a vertical stack in a vertical direction, which is substantially perpendicular to a first semiconductor die in the vertical stack. Moreover, each semiconductor die, after the first semiconductor die, is offset in a horizontal direction by an offset value from an immediately preceding semiconductor die in the vertical stack, thereby defining a stepped terrace at one side of the vertical stack. Furthermore, a ramp component is electrically and rigidly mechanically coupled to the semiconductor dies. This ramp component is positioned on the one side of the vertical stack, and is approximately parallel to a direction along the stepped terrace, which is between the horizontal direction and the vertical direction. Additionally, each of the semiconductor dies includes a static bend so that an end segment of each of the semiconductor dies is parallel to the direction and is mechanically coupled to the ramp component.

Note that stress in each of the semiconductor dies associated with the bend may be less than a yield strength of the semiconductor die. Furthermore, a thickness of each of the semiconductor dies may be defined such that each of the semiconductor dies has a bending moment that facilitates the bend.

The ramp component may be electrically coupled to the semiconductor dies using a variety of techniques. For example, the ramp component may be soldered to each of the semiconductor dies, such as at the end segment of each of the semiconductor dies. Alternatively or additionally, the ramp component may be electrically coupled to the end segment of each of the semiconductor dies by microsprings and/or an anisotropic conductive film. Furthermore, in some embodiments the ramp component may electrically couple electrical signals between the ramp component and the end segment of each of the semiconductor dies using capacitively coupled proximity communication.

In some embodiments, the ramp component includes: an optical waveguide configured to convey an optical signal along the direction; and a set of optical coupling elements, where a given optical coupling component in the set of optical coupling components may optically couple the optical signal to the end segment of a given semiconductor die in the set of semiconductor dies. Note that the optically coupling may include optical proximity communication.

Moreover, a variety of techniques may be used to align components in the chip package. For example, a surface of the end segment of each of the semiconductor dies may include an etch pit and, for each of the etch pits in the semiconductor dies, the ramp component includes a corresponding etch pit. Furthermore, the chip package may include a set of balls, where a given ball in the set of balls mechanically couples the etch pit in the surface of the end segment and the corresponding etch pit in the ramp component.

Another embodiment provides an electronic device (such as a computer system) that includes the chip package.

Another embodiment provides a method for communicating a signal. During this method the signal is conveyed in the ramp component which is electrically and rigidly mechanically coupled to the set of semiconductor dies that are arranged in the vertical stack in the vertical direction. Note that the semiconductor dies are offset from each other in the horizontal direction, thereby defining the stepped terrace on one side of the vertical stack. Furthermore, the ramp component is positioned on the one side of the vertical stack approximately parallel to the direction along the stepped terrace, which is between the horizontal direction and the vertical direction. Then, the signal is coupled to a given semiconductor die in the set of semiconductor dies at an end segment of the given semiconductor die, where the given semiconductor die includes a static bend so that the end segment is parallel to the direction and is mechanically coupled to the ramp component.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of a chip package, an electronic device that includes the chip package, and a method for communicating signals in the chip package are described. This chip package includes a vertical stack of semiconductor dies or chips that are offset from each other in a horizontal direction, thereby defining a terrace with exposed pads. A high-bandwidth ramp component, which is positioned approximately parallel to the terrace, is electrically and mechanically coupled to the exposed pads. For example, the ramp component may be coupled to the semiconductor dies using: solder, microsprings and/or an anisotropic conducting film. Furthermore, each of the semiconductor dies includes a static bend so that an end segment of each of the semiconductor dies is parallel to the direction and is mechanically coupled to the ramp component. These end segments may facilitate high-bandwidth communication of signals between the semiconductor dies and the ramp component, for example, via proximity communication.

By removing the need for costly and area-consuming through-silicon vias (TSVs) in the semiconductor dies, the chip package may provide high bandwidth and low cost. For example, the cost may be reduced by avoiding the processing operations and the wasted area associated with TSVs in the semiconductor dies. Thus, the chips in the stack may be fabricated using standard processing. Furthermore, the solder, microsprings and/or an anisotropic film may have a lower cost and/or may offer improved reliability than wire bonding. In addition, the ramp component can offer higher inter-component communication bandwidth and reduced latency than wire bonding, and can have comparable communication bandwidth and latency to those offered by semiconductor dies that include TSVs.

Figure 1:
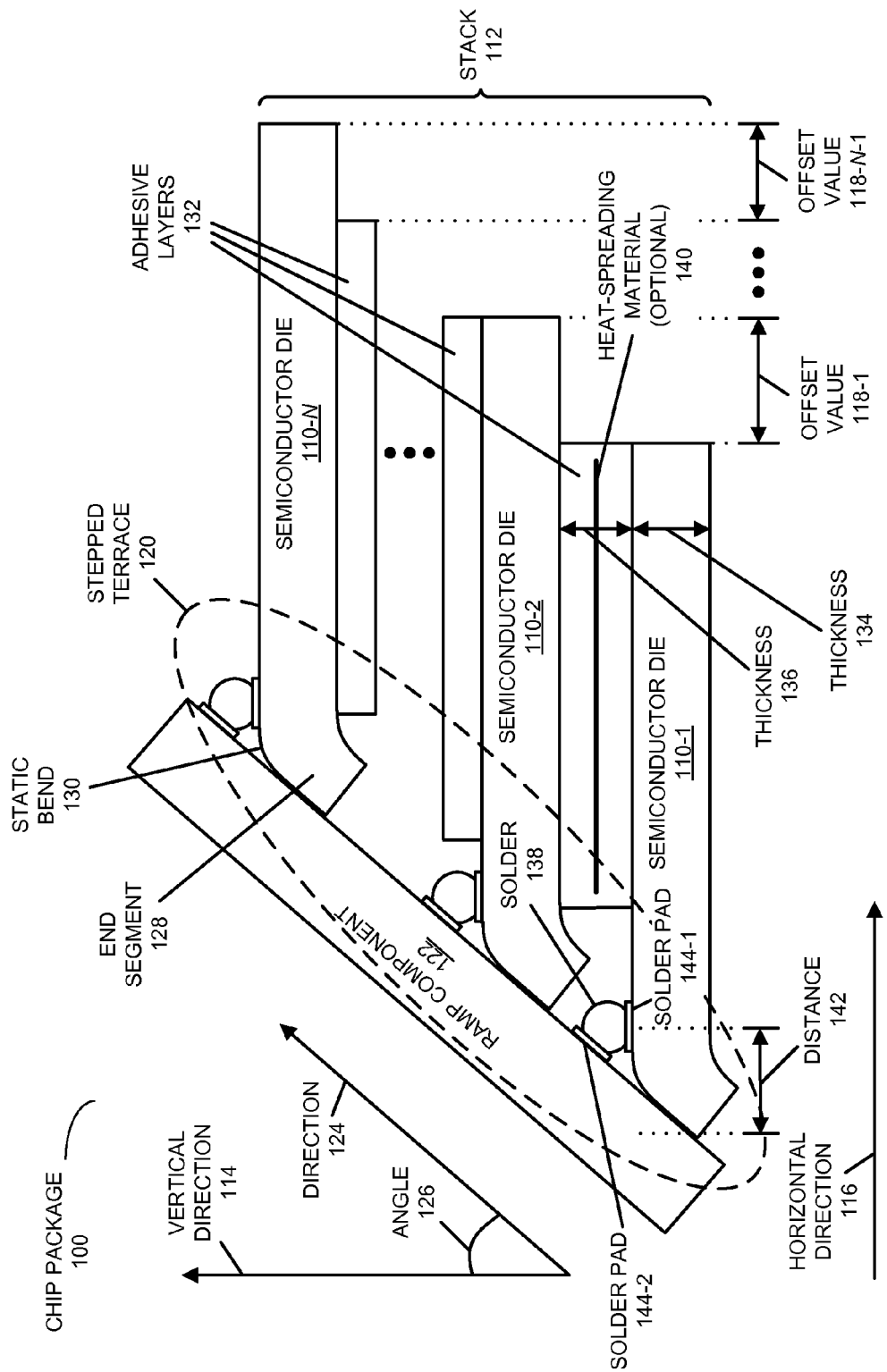
FIG. 1 is a block diagram illustrating a side view of a chip package in accordance with an embodiment of the present disclosure.

We now describe embodiments of the chip package. FIG. 1 presents a block diagram illustrating a side view of a chip package 100. In this chip package (which is sometimes referred to as a 'ramp-stack chip package'), a set of semiconductor dies 110 is arranged in a stack 112 in vertical direction 114. Note that vertical direction 114 is substantially perpendicular to semiconductor die 110-1 in stack 112 (and, thus, is substantially perpendicular to horizontal direction 116 in a plane of semiconductor die 110-1). Additionally, each semiconductor die, after semiconductor die 110-1, may be offset in horizontal direction 116 by an associated one of offset values 118 from an immediately preceding semiconductor die in stack 112, thereby defining a stepped terrace 120 at one side of stack 112. These offset values may have approximately a constant value for the set of semiconductor dies 110 or may vary over the set of semiconductor dies 110 (i.e., the offset values for different steps in stepped terrace 120 may be different).

Moreover, a high-bandwidth ramp component 122 is rigidly mechanically and electrically coupled to semiconductor dies 110, thereby facilitating communication between semiconductor dies 110 and/or supplying power to semiconductor dies 110. This ramp component 122 is positioned on the one side of stack 112, and is approximately parallel to a direction 124 (at angle 126) along stepped terrace 120, which is between horizontal direction 116 and vertical direction 114. In addition, the rigid mechanical and/or electrical coupling between semiconductor dies 110 and ramp component 122 may occur at end segments (such as end segment 128) of semiconductor dies 110, where semiconductor dies 110 include static bends (such as static bend 130) so that an end segment of each of semiconductor dies 110 is parallel to direction 124. For example, rigid mechanical and electrical coupling to the end segments may occur via solder balls, such as solder ball 138. As described further below, these end segments may provide a large coplanar area that facilitates communication of signals (such as an optical signal or an electrical signal) between ramp component 122 and semiconductor dies 110.

Note that stress in each of semiconductor dies 110 associated with the static bends may be less than a yield strength of a semiconductor in each of the semiconductor dies 110. Furthermore, a thickness 134 of each of semiconductor dies 110 may be defined such that each of the semiconductor dies 110 has a bending moment that facilitates the static bends. Therefore, the static bends may have a small bend radius, which may ensure that there is a larger area for coplanar overlap between the end segments and ramp component 122.

Semiconductor dies 110 in stack 112 may be mechanically coupled to each other by adhesive layers 132, such as an epoxy or glue that cures in 10 s at 150 C. Furthermore, a given semiconductor die in the set of semiconductor dies 110 may have a nominal thickness 134, and adhesive layers 132 may have nominal thickness 136. However, note that in some embodiments the thickness of at least some of semiconductor dies 110 and/or adhesive layers 132 in stack 112 may be different (for example, thicknesses of either or both semiconductor dies 110 and adhesive layers 132 may vary along vertical direction 114).

In an exemplary embodiment, nominal thickness 134 is between 50 and 100 μm. (However, in other embodiments thickness 134 may be between 30 and 250 μm.) Note that for nominal thickness 134 between 50 and 100 μm, angle 126 may be between 10 and 15°. In general, nominal thickness 134 depends, in part, on the number of semiconductor dies 110 in stack 112. Furthermore, note that a nominal thickness

136 of adhesive layers 132 may be up to 600 μm. (However, in other embodiments thickness 136 may be as small as 10 μm.)

Additionally, offset values 118 may be determined based on direction 124 (or angle 126) and a nominal thickness of solder (such as solder ball 138) used to rigidly mechanically couple ramp component 122 to set of semiconductor dies 110. Note that the thickness of the solder may be approximately constant over stack 112 or may vary over the stack (i.e., along vertical direction 114).

In some embodiments, an accumulated position error over the set of semiconductor dies 110 in vertical direction 114 (i.e., an accumulated position error in the vertical positions of semiconductor dies over stack 112) is less than a sum of vertical errors associated with the set of semiconductor dies 110 and adhesive layers 132 between the semiconductor dies 110. For example, the accumulated position error may be associated with: thickness variation of the semiconductor dies 110, thickness variation of adhesive layers 132; and/or thickness variation of an optional heat-spreading material 140 (such as pressed graphite fibers) in at least some of adhesive layers 132. In some embodiments, the accumulated position error may be less than 1 μm, and may be as small as 0 μm. Additionally, the set of semiconductor dies 110 may have a maximum position error in the plane (i.e., a maximum error in distance 142), which is associated with edge variation of semiconductor dies 110 (such as a variation in the saw-line position), that is less than a predefined value (for example, the maximum position error may be less than 1 μm, and may be as small as 0 μm). This may be accomplished by using a pick-and-place tool to assemble chip package 100 using optical alignment markers (such as fiducial markers) on semiconductor dies 110 such that distance 142 is measured relative to a center of a saw lane for semiconductor dies 110. In addition, during assembly semiconductor dies 110 may referenced to an assembly component or fixture that includes a stepped terrace that mirrors stepped terrace 120 (instead of referencing each semiconductor die after semiconductor die 110-1 to its immediately preceding semiconductor die in stack 112).

Note that, in order to accommodate mechanical alignment errors in vertical direction 114, the height and pitch of the solder bumps or pads (such as solder pad 144-1 and/or solder pad 144-2) and/or solder ball 138 may vary between at least some of semiconductor dies 110 along vertical direction 114. For example, distance 142 (i.e., the position of solder pad 144-1 relative to a center of a saw lane for semiconductor die 110-1) may be 60 μm and solder pads 144 may each have an 80 μm width. Furthermore, the solder balls (such as solder ball 138) may have a diameter of 120 μm prior to reflowing or melting, and an approximate thickness between 40 and 60 μm after melting. In some embodiments, two or more rows of solder balls may rigidly couple ramp component 122 to a given semiconductor die.

Figure 2:
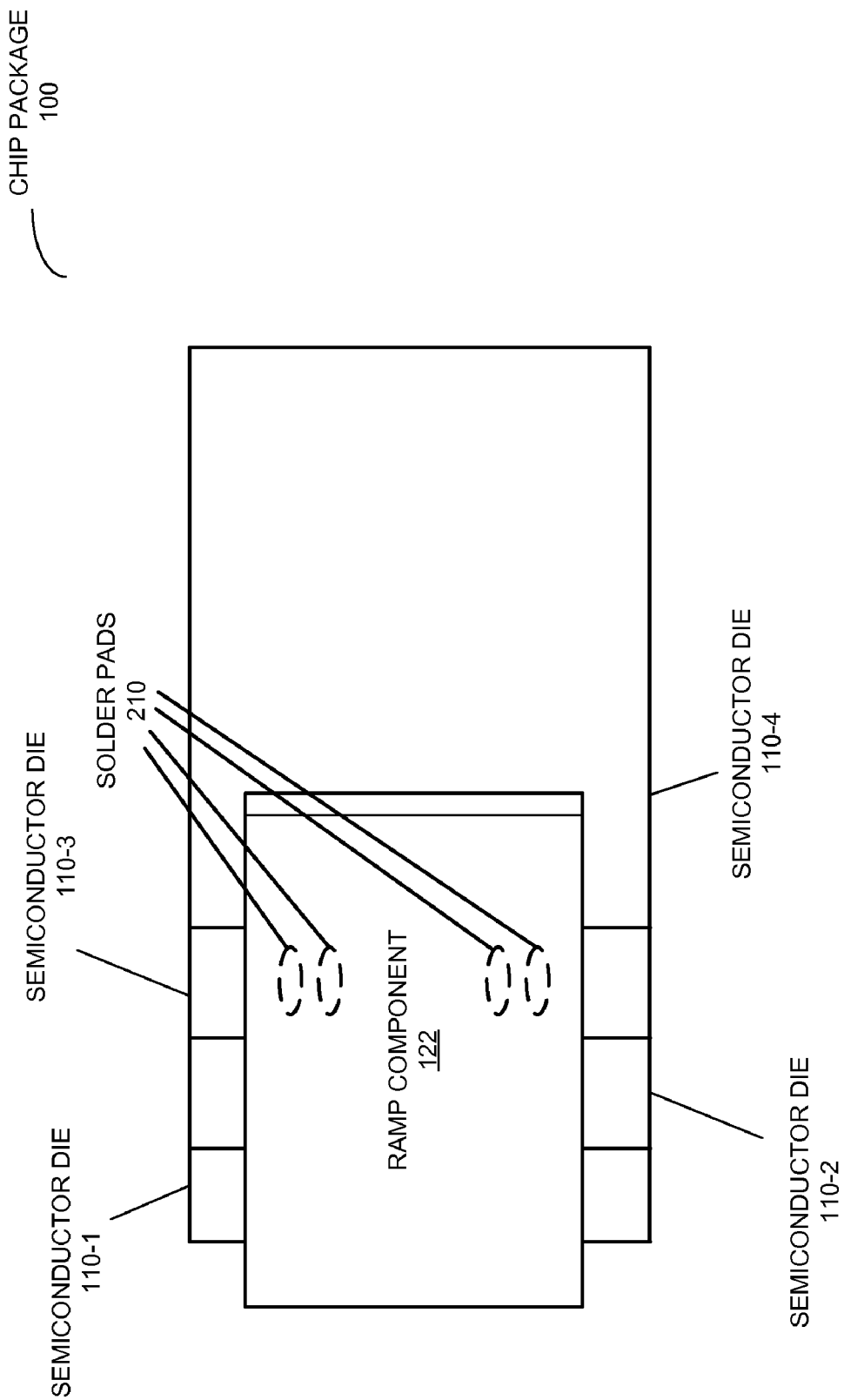
FIG. 2 is a block diagram illustrating a top view of the chip package in FIG. 1 in accordance with an embodiment of the present disclosure.

FIG. 2 presents a block diagram illustrating a top view of chip package 100 in which stack 112 (FIG. 1) includes four semiconductor dies 110. This view of chip package 100 illustrates that in some embodiments solder pads 210 may have non-rectangular shapes. For example, solder pads 210 may have oblong shapes, such as those that are 80 μm wide and 120 μm long. These solder-pad shapes on semiconductor dies 110 and/or ramp component 122 may tolerate some horizontal and/or vertical position errors.

In some embodiments, the solder pads can be moved to an edge of ramp component 122. This may facilitate a perpendicular orientation (i.e., angle 126 in FIG. 1 may be 0°). This configuration may facilitate a memory module in which contacts or pads associated with input/output (I/O) signal lines and power lines are at the edge of the ramp component (instead of down the 'spine'). In this way, a number of diffusion layers in the ramp component may be reduced. For example, there may be 60 contacts or pads along an edge of ramp component 122 in this memory module.

Figure 3:
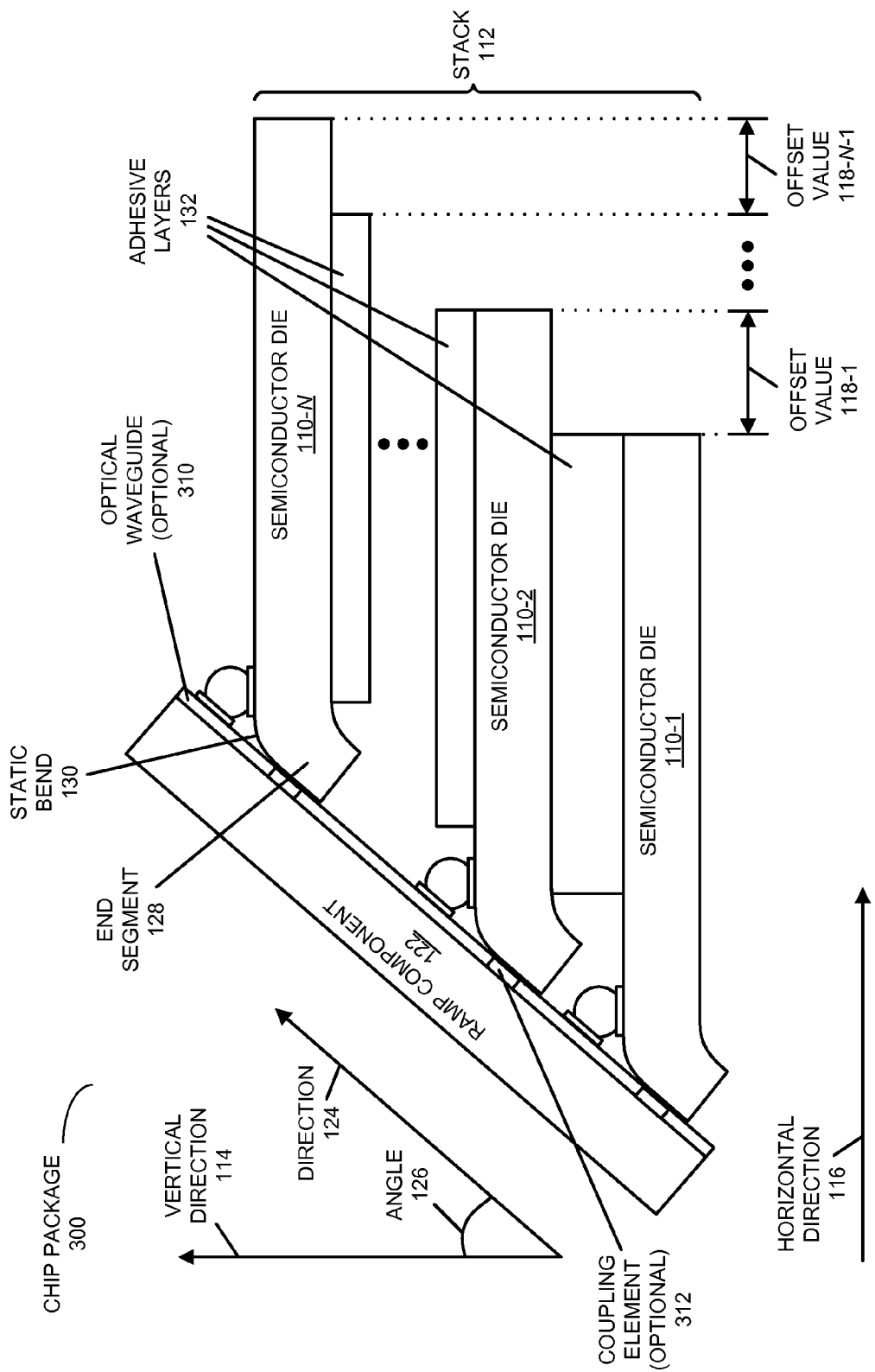
FIG. 3 is a block diagram illustrating a side view of a chip package in accordance with an embodiment of the present disclosure.

As shown in FIG. 3, which presents a block diagram illustrating a side view of a chip package 300, in some embodiments ramp component 122 includes an optional optical waveguide 310 configured to convey an optical signal along direction 124. Furthermore, a set of optional coupling elements (such as optional coupling element 312) may optically couple the optical signal to and/or from one or more of the end segments of semiconductor dies 110, where a given coupling element optically couples the optical signal to and/or from a given semiconductor die (thus, optional coupling element 312 may optically couple the optical signal to and/or from the end segment of semiconductor die 110-2). Note that the optional coupling elements may be optical coupling elements, such as: a diffraction grating, an angled reflector or a mirror, a beam splitter and/or a lens. As described further below, in some embodiments communicating the optical signal to and/or from the end segment(s) may involve optical proximity communication of an optically coupled signal (which may offer high-bandwidth and low-latency communication).

Alternatively, in other embodiments, such as that shown in FIG. 1, ramp component 122 includes a signal line that conveys an electrical signal. In these embodiments, ramp component 122 may be electrically and/or mechanically coupled to the end segments of semiconductor dies 110 using a variety of techniques, including: solder, microsprings, micro-spheres (in a ball-in-pit configuration, which is described below with reference to FIG. 4) and/or an anisotropic conductive film (such as an anisotropic elastomer film, which is sometimes referred to as an 'anisotropic conductive film'). Furthermore, as described further below, communicating the electrical signal to and/or from the end segment(s) may involve proximity communication (P×C), such as capacitively coupled proximity communication of a capacitively coupled signal (which may offer high-bandwidth and low-latency communication) via P×C connectors (not shown) on or near surfaces of ramp component 122 and the end segments.

Thus, in some embodiments the communication between ramp component 122 and the end segments of semiconductor dies 110 (and, more generally, between components in the chip package or between the chip package and an external device) may involve P×C of electromagnetically coupled signals, such as: communication of capacitively coupled signals (which is referred to as 'electrical proximity communication'), communication of optically coupled signals (which is referred to as 'optical proximity communication'), communication of electromagnetically coupled signals (which is referred to as 'electromagnetic proximity communication'), communication of inductively coupled signals, and/or communication of conductively coupled signals.

In embodiments where electrical signals are communicated using P×C, the impedance of the resulting electrical contacts may be, in general, conductive and/or capacitive, i.e., may have a complex impedance that includes an in-phase component and/or an out-of-phase component. Regardless of the electrical contact mechanism (such as solder, microsprings, an anisotropic layer, etc.), if the impedance associated with the contacts is conductive, conventional transmit and receive I/O circuits may be used in components in the embodiments of the chip package. However, for contacts having a complex (and, possibly, variable) impedance, the transmit and receive I/O circuits may include one or more embodiments described in U.S. patent application Ser. No. 12/425,871, entitled "Receive Circuit for Connectors with Variable Complex Impedance," by Robert J. Drost et al., Attorney Docket Number SUN09-0285, filed on Apr. 17, 2009, the contents of which are incorporated herein by reference.

Figure 4:
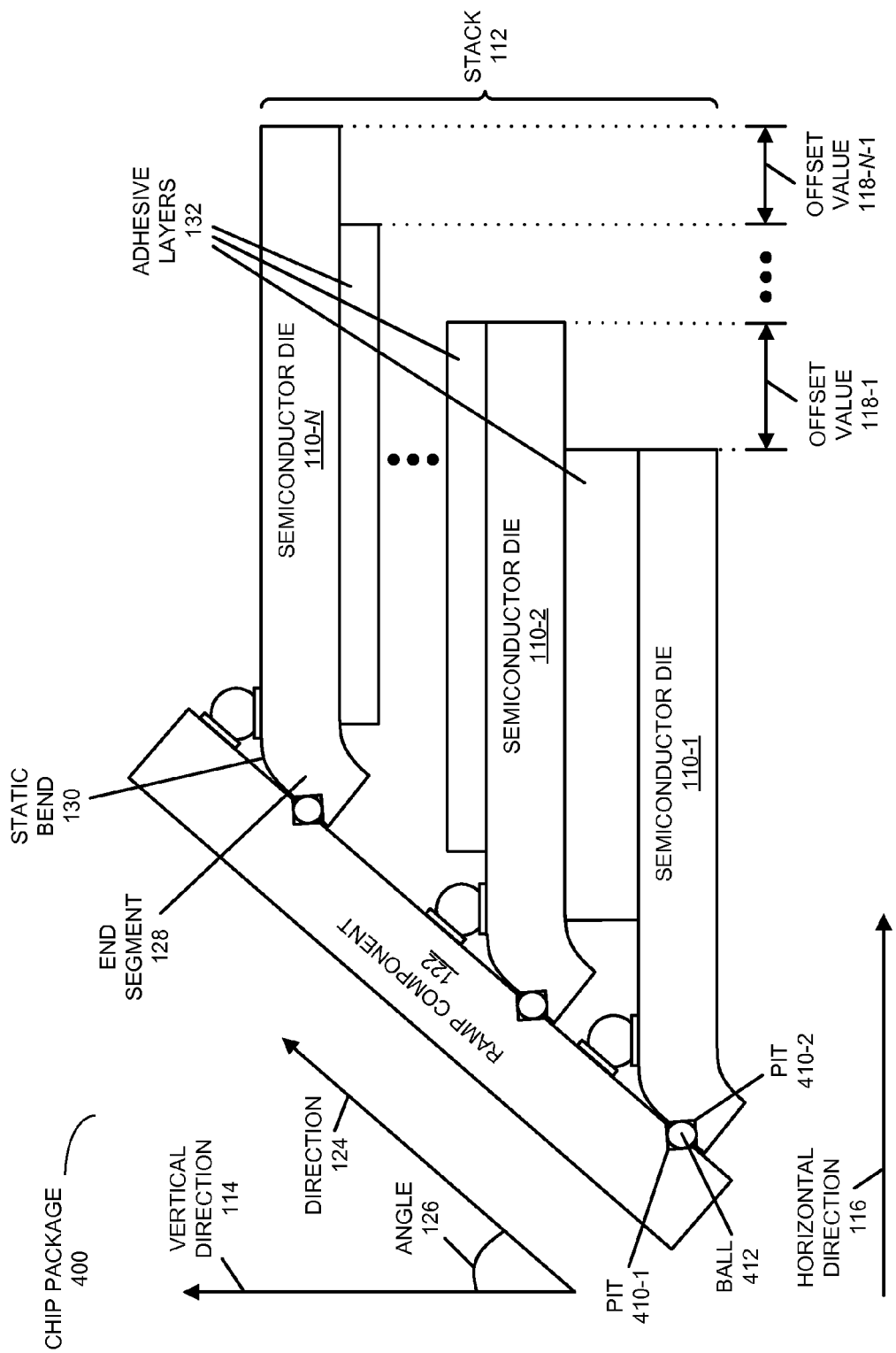
FIG. 4 is a block diagram illustrating a side view of a chip package in accordance with an embodiment of the present disclosure.

While the preceding embodiments illustrate particular configurations of the chip package, a number of techniques and configurations may be used to implement mechanical alignment of components. For example, as shown in FIG. 4, which presents a block diagram illustrating a side view of a chip package 400, semiconductor dies 110 and/or ramp component 122 may be positioned relative to each other using a ball-and-pit alignment technique (and, more generally, a positive-feature-in-negative-feature alignment technique). In particular, balls (such as ball 412) may be positioned into etch pits (such as etch pits 410) to mechanically couple and relatively align the end segments of semiconductor dies 110 and ramp component 122. In some embodiments, the ball-and-pit alignment technique is used to align semiconductor dies 110 in stack 112. While FIG. 4 illustrates balls, a variety of positive features may be used, such as hemisphere-shaped bumps. Thus, in general, a combination of mechanically locking positive and negative surface features on components in the chip package may be used to align and/or assemble the chip package.

Figure 5:
FIG. 5 is a flow diagram illustrating a method for communicating a signal in the chip package in accordance with an embodiment of the present disclosure.

We now describe embodiments of the method. FIG. 5 presents a flow diagram illustrating a method 500 for communicating a signal in a chip package (such as chip package 100 in FIGS. 1 and 2). During this method the signal is conveyed in a ramp component which is electrically and rigidly mechanically coupled to a set of semiconductor dies that are arranged in a vertical stack in a vertical direction (operation 510). Note that the semiconductor dies are offset from each other in a horizontal direction, thereby defining a stepped terrace on one side of the vertical stack. Furthermore, the ramp component is positioned on the one side of the vertical stack approximately parallel to a direction along the stepped terrace, which is between the horizontal direction and the vertical direction. Then, the signal is coupled to a given semiconductor die in the set of semiconductor dies at an end segment of the given semiconductor die (operation 512), where the given semiconductor die includes a static bend so that the end segment is parallel to the direction and is mechanically coupled to the ramp component.

In some embodiments of method 500 there may be additional or fewer operations. Moreover, the order of the operations may be changed, and/or two or more operations may be combined into a single operation.

Figure 6:
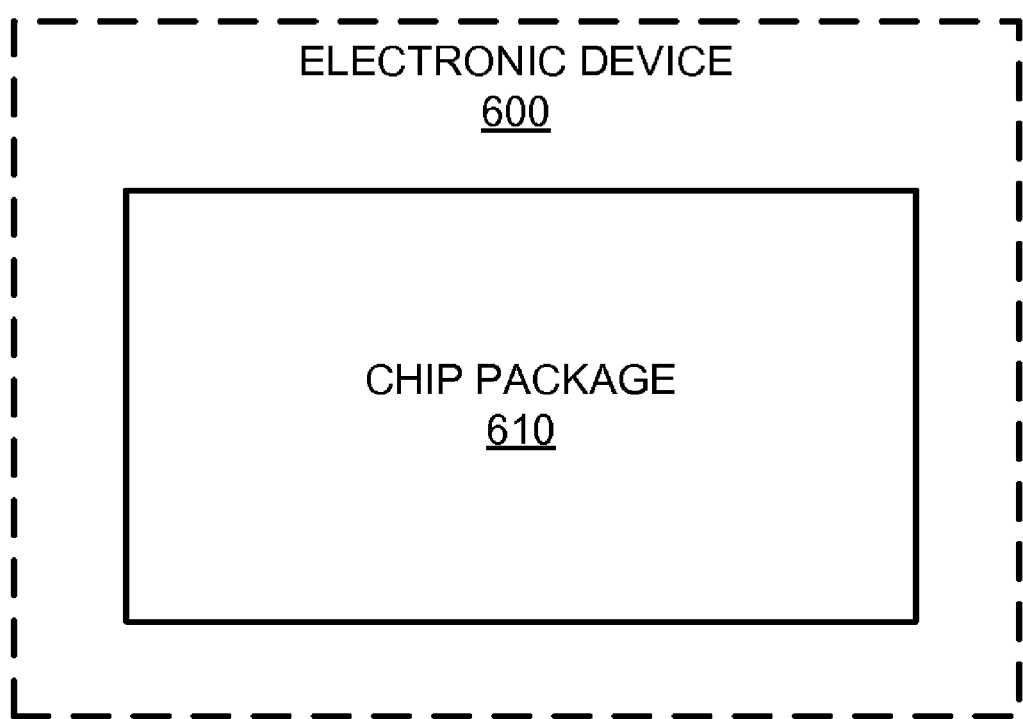
FIG. 6 is a block diagram illustrating an electronic device that includes the chip package in accordance with an embodiment of the present disclosure.

We now describe embodiments of the electronic device. FIG. 6 presents a block diagram illustrating an electronic device 600 that includes a chip package 610 (which may be one of the preceding embodiments of the chip package).

In an exemplary embodiment, a chip package (such as one of the preceding embodiments of the chip package) may facilitate high-performance devices. For example, in some embodiments a ramp-stack chip package is included in a dual in-line memory module. For example, there may be up to 80 memory devices (such as dynamic random access memory or another type of memory-storage device) in the ramp-stack chip package. If needed, 'bad' or faulty memory devices can be disabled. Thus, 72 memory devices (out of 80) may be used. Furthermore, this configuration may expose the full bandwidth of the memory devices in the memory module, such that there is little or no latency delay in accessing any of the memory devices.

Alternatively, the dual in-line memory module may include multiple fields that each can include a ramp-stack chip package. For example, there may be four ramp-stack chip packages (which each include nine memory devices) in a dual in-line memory module.

In some embodiments, one or more of these dual in-line memory modules (which can include one or more ramp-stack chip packages) may be coupled to a processor. For example, the processor may be coupled to the one or more dual in-line memory modules using capacitive proximity communication of capacitively coupled signals. In turn, the processor may be mounted on a substrate using C4 solder balls.

Thus, electronic device 600 may include a device or a system, such as: a VLSI circuit, a switch, a hub, a bridge, a router, a communication system, a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Note that a given computer system may be at one location or may be distributed over multiple, geographically dispersed locations.

Chip packages 100 (FIGS. 1 and 2), 300 (FIGS. 3) and 400 (FIG. 4), as well as electronic device 600 may include fewer components or additional components. For example, there may be breaks defined in a stack of semiconductor dies in a ramp-stack chip package, such as by not including solder pads for one or more of the semiconductor dies on the ramp component. Additionally, one or more components in an embodiment of the chip package may include: an optical modulator, an optical multiplexer (such as an add filter), an optical de-multiplexer (such as a drop filter), an optical filter and/or an optical switch.

Moreover, although these devices and systems are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed. In addition, functionality in the preceding embodiments may be implemented more in hardware and less in software, or less in hardware and more in software, as is known in the art.

While the preceding embodiments use semiconductor dies (such as silicon) in the chip package, in other embodiments a different material than a semiconductor may be used as the substrate material in one or more of these chips. However, in embodiments in which silicon is used, semiconductor dies 110 (FIGS. 1-4) may be fabricated using standard silicon processing. These semiconductor dies may provide silicon area that supports logic and/or memory functionality.

Furthermore, referring back to FIG. 1, ramp component 122 may be a passive component, such as a plastic substrate with metal traces to electrically couple to semiconductor dies 110. For example, ramp component 122 may be fabricated using injection-molded plastic. Alternatively, ramp component 122 may be another semiconductor die with one or more lithographically defined wires, signal lines or optical waveguides. For example, optional optical waveguide 310 (FIG. 3) may be implemented using silicon-on-insulator technology. In embodiments where ramp component 122 includes a semiconductor die, active devices, such as limit amplifiers, may be included to reduce cross-talk between the signal lines. Additionally, cross-talk may be reduced in either an active or a passive ramp component 122 using differential signaling.

In some embodiments, ramp component 122 includes transistors and wires that shuttle data and power signals among semiconductor dies 110 via solder balls (such as solder ball 138). For example, ramp component 122 may include high-voltage signals.

These signals may be stepped down for use on semiconductor dies 110 using: a step-down regulator (such as a capacitor-to-capacitor step-down regulator), as well as capacitor and/or inductor discrete components to couple to semiconductor dies 110.

Additionally, ramp component 122 may include a buffer or logic chip for memory, and/or I/O connectors to external device(s) and/or system(s). For example, the I/O connectors may include one or more: ball bonds, wire bonds, edge connectors and/or P×C connectors for coupling to external devices. In some embodiments, these I/O connectors may be on a back surface of ramp component 122, and ramp component 122 may include one or more through-silicon vias (TSVs) that couple the I/O connectors to additional connectors near semiconductor dies 110, such as P×C connectors or solder pads (e.g., solder pad 144-2).

In some embodiments, ramp component 122 and semiconductor dies 110 in one or more embodiments of the chip package are mounted on an optional substrate (such as a printed circuit board or a semiconductor die). This optional substrate may include: ball bonds, wire bonds, edge connectors and/or P×C connectors for coupling to external devices. If these I/O connectors are on a back surface of the optional substrate, the optional substrate may include one or more TSVs.

As noted previously, in some embodiments optional heat-spreading material 140 (and, more generally, an intermediate material between semiconductor dies 110 that has a high thermal conductivity) may help remove heat generated during operation of circuits on one or more semiconductor dies 110 and/or ramp component 122. This thermal management may include any of the following thermal paths: a first thermal path in the plane of semiconductor dies 110; a second thermal path in the plane of adhesive layers 132; and/or a third thermal path in the plane of optional heat-spreading material 140. In particular, the thermal flux associated with these thermal paths may be managed independently of each other via thermal coupling at an edge of chip package. Note that this thermal management may include the use of: phase change cooling, immersion cooling, and/or a cold plate. Also note that the thermal flux associated with the first thermal path that diffuses through the cross-sectional area at the edge of the chip package is a function of nominal thickness 134. Thus, the thermal management may be different in chip packages with larger or smaller nominal thicknesses of semiconductor dies 110.

Note that packaging techniques that allow some rework are more cost-effective when faced with lower semiconductor-die yields or high expense to test extensively before packaging and assembly. Therefore, in embodiments where the mechanical and/or electrical coupling between semiconductor dies 110 and ramp component 122 are remateable, the yield of the chip package may be increased by allowing rework (such as replacing a bad chip that is identified during assembly, testing or burn-in). In this regard, remateable mechanical or electrical coupling should be understood to be mechanical or electrical coupling that can be established and broken repeatedly (i.e., two or more times) without requiring rework or heating (such as with solder). In some embodiments, the remateable mechanical or electrical coupling involves male and female components designed to couple to each other (such as components that snap together).

In some embodiments there may be optional encapsulation around at least a portion of the chip package in the preceding embodiments. Additionally, air gaps between components in the chip package may be underfilled to improve heat removal. This may be facilitated by decreasing angle 126, i.e., semiconductor dies 110 may be tipped more toward vertical direction 114.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A chip package, comprising:
   a set of semiconductor dies arranged in a vertical stack in a vertical direction, which is substantially perpendicular to a first semiconductor die in the vertical stack, wherein each semiconductor die, after the first semiconductor die, is offset in a horizontal direction by an offset value from an immediately preceding semiconductor die in the vertical stack, thereby defining a stepped terrace at one side of the vertical stack; and
   a ramp component, electrically and rigidly mechanically coupled to the semiconductor dies, wherein the ramp component is positioned on the one side of the vertical stack,
   wherein the ramp component is approximately parallel to a direction along the stepped terrace, which is between the horizontal direction and the vertical direction, and
   wherein each of the semiconductor dies includes a static bend so that an end segment of each of the semiconductor dies is parallel to the direction along the stepped terrace and is mechanically coupled to the ramp component.

2. The chip package of claim 1, wherein stress in each of the semiconductor dies associated with the bend is less than a yield strength of the semiconductor die.

3. The chip package of claim 1, wherein a thickness of each of the semiconductor dies is defined such that each of the semiconductor dies has a bending moment that facilitates the bend.

4. The chip package of claim 1, wherein the ramp component is soldered to each of the semiconductor dies.

5. The chip package of claim 1, wherein the ramp component is electrically coupled to the end segment of each of the semiconductor dies by microsprings.

6. The chip package of claim 1, wherein the ramp component is electrically coupled to the end segment of each of the semiconductor dies by solder.

7. The chip package of claim 1, wherein the ramp component is electrically coupled to the end segment of each of the semiconductor dies by an anisotropic conductive film.

8. The chip package of claim 1, wherein the ramp component includes:
an optical waveguide configured to convey an optical signal along the direction parallel to the stepped terrace; and
a set of optical coupling elements, wherein a given optical coupling component in the set of optical coupling components is configured to optically couple the optical signal to the end segment of a given semiconductor die in the set of semiconductor dies.

9. The chip package of claim 8, wherein optical coupling elements in the set of optical coupling elements include optical to electrical transducers.

10. The chip package of claim 1, wherein the ramp component is configured to electrically couple electrical signals between the ramp component and the end segment of each of the semiconductor dies using capacitively coupled proximity communication.

11. The chip package of claim 1, wherein a surface of the end segment of each of the semiconductor dies includes an etch pit;
wherein, for each of the etch pits in the semiconductor dies, the ramp component includes a corresponding etch pit; and
wherein the chip package further includes a set of balls, wherein a given ball in the set of balls mechanically couples the etch pit in the surface of the end segment and the corresponding etch pit in the ramp component.

12. An electronic computing device including a chip package, wherein the chip package includes:
a set of semiconductor dies arranged in a vertical stack in a vertical direction, which is substantially perpendicular to a first semiconductor die in the vertical stack, wherein each semiconductor die, after the first semiconductor die, is offset in a horizontal direction by an offset value from an immediately preceding semiconductor die in the vertical stack, thereby defining a stepped terrace at one side of the vertical stack; and
a ramp component, electrically and rigidly mechanically coupled to the semiconductor dies, wherein the ramp component is positioned on the one side of the vertical stack,
wherein the ramp component is approximately parallel to a direction along the stepped terrace, which is between the horizontal direction and the vertical direction, and
wherein each of the semiconductor dies includes a static bend so that an end segment of each of the semiconductor dies is parallel to the direction along the stepped terrace and is mechanically coupled to the ramp component.

13. The electronic computing device of claim 12, wherein stress in each of the semiconductor dies associated with the bend is less than a yield strength of the semiconductor die.

14. The electronic computing device of claim 12, wherein a thickness of each of the semiconductor dies is defined such that each of the semiconductor dies has a bending moment that facilitates the bend.

15. The electronic computing device of claim 12, wherein the ramp component is soldered to each of the semiconductor dies.

16. The electronic computing device of claim 12, wherein the ramp component is electrically coupled to the end segment of each of the semiconductor dies by one of: microsprings, solder and an anisotropic conductive film.

17. The electronic computing device of claim 12, wherein the ramp component includes:
an optical waveguide configured to convey an optical signal along the direction along the stepped terrace; and
a set of optical coupling elements, wherein a given optical coupling component in the set of optical coupling components is configured to optically couple the optical signal to the end segment of a given semiconductor die in the set of semiconductor dies.

18. The electronic computing device of claim 17, wherein optical coupling elements in the set of optical coupling elements include optical to electrical transducers.

19. The electronic computing device of claim 12, wherein the ramp component is configured to electrically couple electrical signals between the ramp component and the end segment of each of the semiconductor dies using capacitively coupled proximity communication.

20. A method for communicating a signal, comprising:
conveying the signal in a ramp component that is electrically and rigidly mechanically coupled to a set of semiconductor dies that are arranged in a vertical stack in a vertical direction, wherein the semiconductor dies are offset from each other in a horizontal direction, thereby defining a stepped terrace on one side of the vertical stack, and wherein the ramp component is positioned on the one side of the vertical stack approximately parallel to a direction along the stepped terrace, which is between the horizontal direction and the vertical direction; and
coupling the signal to a given semiconductor die in the set of semiconductor dies at an end segment of the given semiconductor die, wherein the given semiconductor die includes a static bend so that the end segment is parallel to the direction along the stepped terrace and is mechanically coupled to the ramp component.

* * * * *